(12) United States Patent
Wu et al.

(10) Patent No.: US 10,643,873 B2
(45) Date of Patent: May 5, 2020

(54) CLUSTER TOOL APPARATUS AND A METHOD OF CONTROLLING A CLUSTER TOOL APPARATUS

(71) Applicant: Macau University of Science and Technology, Taipa (MO)

(72) Inventors: Naiqi Wu, Taipa (MO); Fajun Yang, Taipa (MO); Yan Qiao, Taipa (MO); Mengchu Zhou, Taipa (MO); Zhiwu Li, Taipa (MO)

(73) Assignee: MACAU UNIVERSITY OF SCIENCE AND TECHNOLOGY, Taipa (MO)

( * ) Notice: Subject to any disclaimer, the term of this patent is extended or adjusted under 35 U.S.C. 154(b) by 132 days.

(21) Appl. No.: 15/263,615

(22) Filed: Sep. 13, 2016

(65) Prior Publication Data
US 2018/0076064 A1   Mar. 15, 2018

(51) Int. Cl.
*H01L 21/67* (2006.01)
*H01L 21/677* (2006.01)
*G05B 19/418* (2006.01)

(52) U.S. Cl.
CPC .. *H01L 21/67167* (2013.01); *G05B 19/41865* (2013.01); *H01L 21/67745* (2013.01); *G05B 2219/32165* (2013.01); *G05B 2219/45031* (2013.01); *Y10S 901/41* (2013.01)

(58) Field of Classification Search
None
See application file for complete search history.

(56) References Cited

PUBLICATIONS

W. K. V. Chan, J. Yi, and S. Ding, "Optimal Scheduling of Multicluster Tools with Constant Robot Moving Times, Part I: Two-Cluster Analysis", IEEE Transactions on Automation Science and Engineering, vol. 8, No. 1, Jan. 2011, pp. 5-16.
Y. Crama, V. Kats, J. Van De Klundert, and E. Levner, "Cyclic Scheduling in Robotic Flowshops", Annals of Operations Research, vol. 96, No. 1-4, 2000, pp. 97-124.
M. Dawande, C. Sriskandarajah, and S. Sethi, "On Throughput Maximization in Constant Travel-Time Robotic Cells", Manufacturing & Service Operations Management, vol. 4, No. 4, Fall 2002, pp. 296-312.
H. N. Geismar, C. Sriskandarajah, and N. Ramanan, "Increasing Throughput for Robotic Cells with Parallel Machines and Multiple Robots", IEEE Transactions on Automation Science and Engineering, vol. 1, No. 1, Jul. 2004, pp. 84-89.

(Continued)

*Primary Examiner* — Carlos R Ortiz Rodriguez
(74) *Attorney, Agent, or Firm* — Renner Kenner Greive Bobak Taylor & Weber

(57) ABSTRACT

A system and method of controlling a cluster tool apparatus, wherein the cluster tool includes one or more processing modules and a robot that is configured to move a semiconductor product to and from the one or more processing modules, the cluster tool configured for processing semiconductor products. The method of controlling the cluster tool apparatus to perform a processing cycle includes receiving a plurality of system parameters from a user interface, wherein the system parameters relate to one or more processing steps of the processing cycle, determining a schedule for performing the processing cycle utilizing the one or more processing modules, wherein the schedule being determined based on a semiconductor product residency parameter.

13 Claims, 9 Drawing Sheets

(56) References Cited

PUBLICATIONS

J-H. Kim, T-E. Lee, H-Y. Lee, and D-B. Park, "Scheduling Analysis of Time-Constrained Dual-Armed Cluster Tools", IEEE Transactions on Semiconductor Manufacturing, vol. 16, No. 3, Aug. 2003, pp. 521-534.

H-J. Kim, J-H. Lee, C. Jung, and T-E. Lee, "Scheduling Cluster Tools with Ready Time Constraints for Consecutive Small Lots", IEEE Transactions on Automation Science and Engineering, vol. 10, No. 1, Jan. 2013, pp. 145-159.

H-J. Kim, J-H. Lee, and T-E. Lee, "Noncyclic Scheduling of Cluster Tools with a Branch and Bound Algorithm", IEEE Transactions on Automation Science and Engineering, vol. 12, No. 2, Apr. 2015, pp. 690-700.

M. J. Lopez and S. C. Wood, "Systems of Multiple Cluster Tools: Configuration, Reliability, and Performance", IEEE Transactions on Semiconductor Manufacturing, vol. 16, No. 2, May 2003, pp. 170-178.

T-E. Lee and S-H. Park, "An Extended Event Graph with Negative Places and Tokens for Time Window Constraints", IEEE Transactions on Automation Science and Engineering, vol. 2, No. 4, Oct. 2005, pp. 319-332.

H-Y. Lee and T-E. Lee, "Scheduling Single-Armed Cluster Tools with Reentrant Wafer Flows", IEEE Transactions on Semiconductor Manufacturing, vol. 19, No. 2, May 2006, pp. 226-240.

T. L. Perkinson, P. K. McLarty, R. S. Gyurcsik, and R. K. Cavin III, "Single-Wafer Cluster Tool Performance: An Analysis of Throughput", IEEE Transactions on Semiconductor Manufacturing, vol. 7, No. 3, Aug. 1994, pp. 369-373.

T. L. Perkinson, R. S. Gyurcsik, and P. K. McLarty, "Single-Wafer Cluster Tool Performance: An Analysis of the Effects of Redundant Chambers and Revisitation Sequences on Throughput", IEEE Transactions on Semiconductor Manufacturing, vol. 9, No. 3, Aug. 1996, pp. 384-400.

S. Rostami, B. Hamidzadeh, and D. Camporese, "An Optimal Periodic Scheduler for Dual-Arm Robots in Cluster Tools with Residency Constraints", IEEE Transactions on Robotics and Automation, vol. 17, No. 5, Oct. 2001, pp. 609-618.

S. P. Sethi, C. Sriskandarajah, G. Sorger, J. Blazewicz, and W. Kubiak, "Sequencing of Parts and Robot Moves in a Robotic Cell", International Journal of Flexible Manufacturing Systems, vol. 4, No. 3-4, 1992, pp. 331-358.

S. Venkatesh, R. Davenport, P. Foxhoven, and J. Nulman, "A Steady-State Throughput Analysis of Cluster Tools: Dual-Blade Versus Single-Blade Robots", IEEE Transactions on Semiconductor Manufacturing, vol. 10, No. 4, Nov. 1997, pp. 418-424.

N. Wu, "Necessary and Sufficient Conditions for Deadlock-Free Operation in Flexible Manufacturing Systems Using a Colored Petri Net Model", IEEE Transactions on Systems, Man, and Cybernetics—Part C: Applications and Reviews, vol. 29, No. 2, May 1999, pp. 192-204.

N. Wu, C. Chu, F. Chu, and M. C. Zhou, "A Petri Net Method for Schedulability and Scheduling Problems in Single-Arm Cluster Tools with Wafer Residency Time Constraints", IEEE Transactions on Semiconductor Manufacturing, vol. 21, No. 2, May 2008, pp. 224-237.

N. Wu, F. Chu, C. Chu, and M. Zhou, "Petri Net-Based Scheduling of Single-Arm Cluster Tools with Reentrant Atomic Layer Deposition Processes", IEEE Transactions on Automation Science and Engineering, vol. 8., No. 1, Jan. 2011, pp. 42-55.

N. Wu, F. Chu, C. Chu, and M. Zhou, "Petri Net Modeling and Cycle-Time Analysis of Dual-Arm Cluster Tools with Wafer Revisiting", IEEE Transactions on Systems, Man, and Cybernetics: Systems, vol. 43, No. 1, Jan. 2013, pp. 196-207.

N. Wu and M. Zhou, "Avoiding Deadlock and Reducing Starvation and Blocking in Automated Manufacturing Systems", IEEE Transactions on Robotics and Automation, vol. 17, No. 5, Oct. 2001, pp. 658-669.

N. Wu and M. Zhou, "Process vs. Resource-Oriented Petri Net Modeling of Automated Manufacturing Systems", Asian Journal of Control, vol. 12, No. 3, 2010, pp. 267-280.

N. Wu and M. Zhou, "A Closed-Form Solution for Schedulability and Optimal Scheduling of Dual-Arm Cluster Tools with Wafer Residencey Time Constraint Based on Steady Schedule Analysis", IEEE Transactions on Automation Science and Engineering, vol. 7, No. 2, Apr. 2010, pp. 303-315.

W. M. Zuberek, "Timed Petri Nets in Modeling and Analysis of Cluster Tools", IEEE Transactions on Robotics Automation, vol. 17, No. 5, Oct. 2001, pp. 562-575.

Time duration associated with transitions and places
500

| Symbol | Transition or place | Action | Time duration |
|---|---|---|---|
| $\lambda$ | $t_i \in T$ | Robot loads a wafer into Step i, $i \in \Omega_n$ | $\lambda$ |
|  | $u_i \in T$ | Robot unloads a wafer from Step i, $i \in \Omega_n$ | $\mu$ |
|  | $y_i \in T$ | Robot moves from Steps j to i, $j \neq i$ and $j, i \in \Omega_n$, without holding a wafer | $\mu$ |
| $\mu$ | $y_i \in T$ | Robot moves from one PM to another within Step i when $m_i > 1$, $i \in \Omega_n$, without holding a wafer | $\mu$ |
|  | $y_i \in T$ | Robot moves from Step i to i with $m_i = 1$, $i \in \Omega_n$, without holding a wafer | 0 |
|  | $x_i \in P$ | Robot moves from Steps i-1 to i, $i \in \mathbb{N}_n$, with a wafer being held | $\mu$ |
|  | $x_0 \in P$ | Robot moves from Step n to 0, with a wafer being held | |
| $\tau_i$ | $p_i \in P$ | A wafer being processed and waiting in $p_i$, $i \in \mathbb{N}_n$ | $[\alpha_i, \alpha_i + \delta_i]$ |
| $\omega_i$ | $q_i \in P$ | Robot waits before unloading a wafer from Step i, $i \in \Omega_n$ | $\geq 0$ |

Fig.5

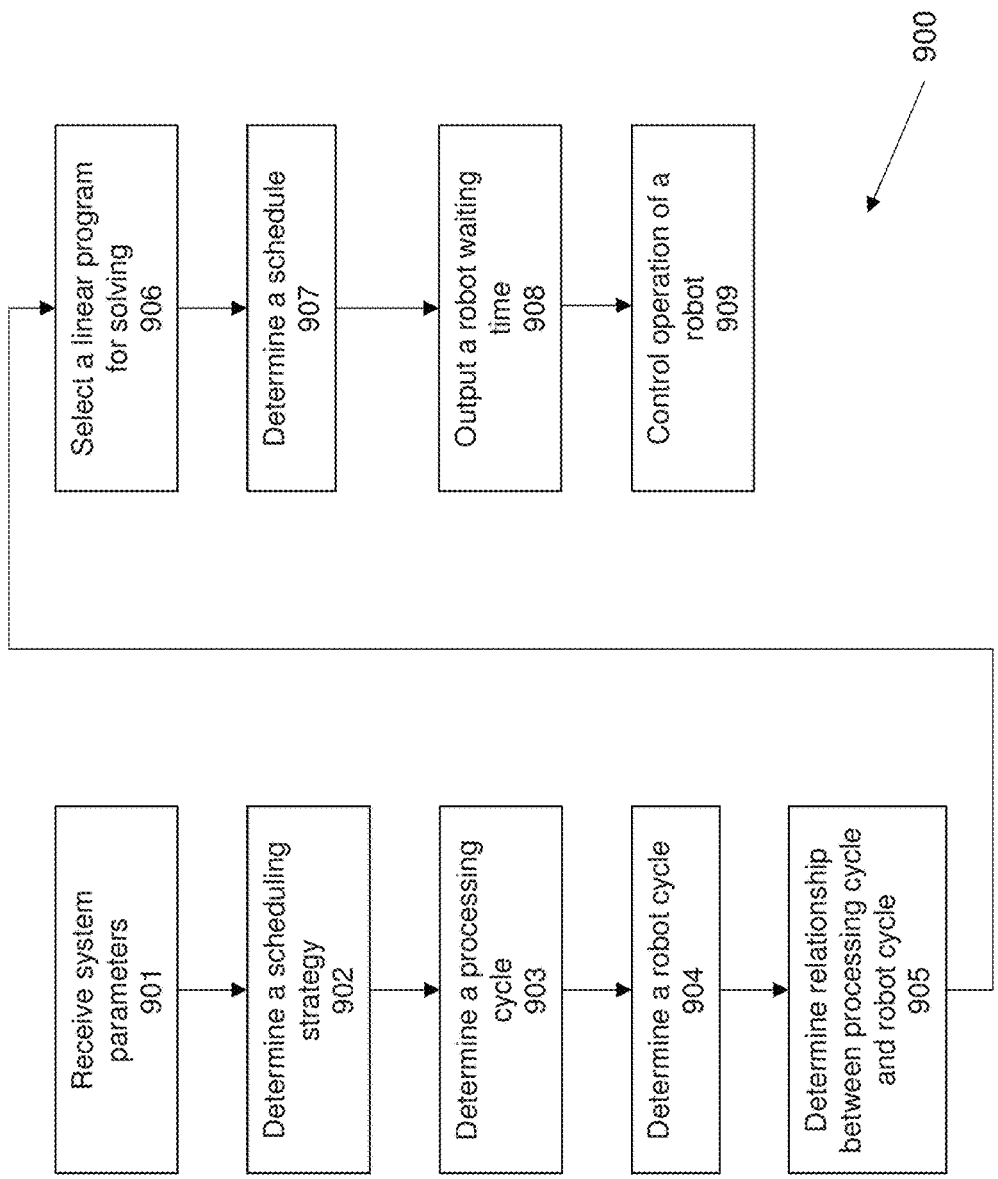

CLUSTER TOOL APPARATUS AND A METHOD OF CONTROLLING A CLUSTER TOOL APPARATUS

TECHNICAL FIELD

The present disclosure relates to a cluster tool apparatus and a method of controlling the cluster tool apparatus, in particular but not limited to, the present disclosure is related to a cluster tool apparatus for processing semiconductor products and a method of controlling the cluster tool apparatus to minimize a cycle time of the cluster tool apparatus.

BACKGROUND

Semiconductors are ubiquitous in modern society and used in a wider range of uses. Some examples are modern electronic components such as diodes, transistors, etc. Semiconductors are also used commonly to create wafers or substrates that can be used in electronics for fabrication of integrated circuits or printed circuit boards or photovoltaic cells. Wafer fabrication processes are carefully controlled and managed processes.

Cluster tool systems or cluster tool apparatuses are a type of integrated equipment that is used in semiconductor processing methods, in particular cluster tools are used in wafer processing. Cluster tools are used in the wafer manufacturing process. Cluster tools provide a flexible reconfigurable, and efficient environment, resulting in higher productivity while resulting in shorter cycle times.

There is economic interest in optimising the wafer manufacturing process to maximize the production of wafers by reducing the manufacturing time. There exists a need to improve the control of the cluster tool apparatus to reduce inefficiencies and minimize waiting times within the wafer processing cycle.

It is an object of the present disclosure to provide a cluster tool apparatus and a method of controlling the cluster tool apparatus that will ameliorate one or more of the current problems associated with known cluster tool apparatuses or at least provide the public with a useful alternative or choice.

SUMMARY OF THE INVENTION

In accordance with a first aspect, the present disclosure provides a method of controlling a cluster tool apparatus, wherein the cluster tool includes one or more processing modules and a robot that is configured to move a semiconductor product to and from the one or more processing modules, the cluster tool configured for processing semiconductor products, the method of controlling the cluster tool apparatus to perform a processing cycle comprises the steps of:
  receiving a plurality of system parameters from a user interface, wherein the system parameters relate to one or more processing steps of the processing cycle,
  determining a schedule for performing the processing cycle utilizing the one or more processing modules,
  wherein the schedule being determined based on a semiconductor product residency parameter.

In an embodiment the processing cycle includes one or more semiconductor processing steps being conducted by the processing module, a robot loading step where the robot loads the semiconductor product into the processing module, and a robot unloading step where the robot unloads the semiconductor product from the processing module, and;
  wherein the schedule outputs a robot waiting time that minimizes a processing cycle time while maintaining the semiconductor product residency parameter.

In an embodiment the schedule outputs or sets a plurality of robot waiting times, wherein each robot waiting time relates to each processing step of the processing cycle, and;
  the method further comprises the step of controlling the robot operation based on the schedule, the cluster tool apparatus comprising a controller configured to control the operation of the robot based on the schedule.

In an embodiment the schedule is determined mainly by selecting and solving a program from a plurality of programs, wherein the program relates at least the semiconductor residency parameter and a processing cycle time, and each linear program outputting at least the robot waiting times.

In an embodiment the program selected for solving is based on a relationship between the processing cycle time and a robot cycle time, the program being selected from a total of three programs (one program and two linear programs), and wherein the method comprises the step of solving the selected program to obtain the robot waiting time.

In an embodiment the method comprises the step of determining a scheduling strategy for the cluster tool apparatus, wherein the scheduling strategy defines the order of steps in the processing cycle, and wherein solving the program results in defining an optimal schedule based on the robot waiting times.

In an embodiment an algorithm is applied if the robot cycle time equals the processing cycle time, a second linear program being selected if the robot cycle time is less than processing cycle time, and a third linear program being selected program if, for some processing steps, the processing cycle time is greater than the longest natural workload of these processing steps.

In an embodiment the scheduling strategy is determined based on a mathematical model of the cluster tool apparatus processing cycle, the mathematical model includes and utilizes a plurality of system parameters, wherein the system parameters are time values or parameters.

In an embodiment the mathematical model is a petri net that models the processing cycle and wherein the system is modelled as a transport bound cluster tool apparatus, the model further modelling each processing step,
  wherein each processing step is modelled to include a plurality of transitions, and;
  wherein the system parameters are the time duration associated with each transition of a processing step.

In an embodiment the system parameters comprise at least one or more of:
  a time value for processing at each processing module,
  a time value for the robot to move between a processing module if the system includes multiple processing modules,
  a semiconductor product residence time,
  an unloading time value for the robot to unload a semiconductor product from the processing module,
  a loading value unit for the robot to load a semiconductor product into the processing module, wherein the unloading time value and the loading time value are equivalent to each other.

In accordance with a second aspect, the present disclosure provides a cluster tool apparatus for processing a semiconductor product, the cluster tool apparatus comprising;

one or more processing modules,
a robot configured to load, transfer and unload a semiconductor product to and from one or more of the processing modules,
a controller configured to communicate with and control the robot, the controller further configured to execute a method to control the cluster tool apparatus, the method comprising;
receiving a plurality of system parameters from a user interface, wherein the system parameters relate to one or more processing steps of the processing cycle,
determining a schedule for performing the processing cycle utilizing the one or more processing modules,
wherein the schedule being determined based on a semiconductor product residency parameter.

In an embodiment the processing cycle includes one or more semiconductor processing steps being conducted by the processing module, a robot loading step where the robot loads the semiconductor product into the processing module, and a robot unloading step where the robot unloads the semiconductor product from the processing module, and;
wherein the schedule outputs a robot waiting time that minimizes a processing cycle time while maintaining the semiconductor product residency parameter.

In an embodiment the schedule outputs a plurality of robot waiting times, wherein each robot waiting time relates to each processing step of the processing cycle,
the controller configured to control operation of the robot based on the schedule by transmitting appropriate control signals to at least the robot.

In an embodiment the schedule is determined mainly by selecting and solving a program from a plurality of programs, wherein the program relates at least the semiconductor residency parameter and a processing cycle time, and each program outputs at least the robot waiting times.

In an embodiment the controller is configured to select a program from a plurality of programs based on a relationship between the processing cycle time and a robot cycle time, and wherein the controller is further configured to solve the selected program to output a robot waiting time.

In an embodiment the controller is configured to determine a scheduling strategy for the cluster tool apparatus, wherein the scheduling strategy defines the order of steps in the processing cycle, and wherein solving the program results in defining an optimal schedule based on the robot waiting times.

In an embodiment an algorithm is applied if the robot cycle time equals the processing cycle time, a second linear program being selected if the robot cycle time is less than processing cycle time, and a third linear program being selected program if, for some steps, the processing cycle time is greater than the longest natural workload of these processing steps.

In an embodiment the scheduling strategy is determined based on a mathematical model of the cluster tool apparatus processing cycle, the mathematical model includes and utilizes a plurality of system parameters, and wherein the system parameters comprise at least one or more of:
a time value for processing at each processing module,
a time value for the robot to move between a processing module if the system includes multiple processing modules,
a semiconductor product residence time,
an unloading time value for the robot to unload a semiconductor product from the processing module,
a loading value unit for the robot to load a semiconductor product into the processing module, wherein the unloading time value and the loading time value are equivalent to each other.

In an embodiment the mathematical model is a petri net that models the processing cycle, the system is modelled as a transport bound cluster tool apparatus, the model further modelling each processing step,
wherein each processing step is modelled to include a plurality of transitions, and;
wherein the system parameters are the time duration associated with each transition of a processing step.

In an embodiment the controller comprises a processor, a memory unit and a robot interface, the processor being in communication with the memory unit and the robot interface,
the memory unit is a non-transitory computer readable medium, the method to control the cluster tool apparatus being stored as a set of executable instructions,
the processor is configured to communicate with the memory unit, the processor being configured to execute the instructions and perform the method to control the cluster tool apparatus,
wherein the processor communicating with the robot via the robot interface and wherein the processor controlling at least the robot based on the method of controlling a cluster tool apparatus.

BRIEF DESCRIPTION OF THE DRAWINGS

Embodiments of the present invention will now be described, by way of example, with reference to the accompanying drawings in which:

FIG. 5 shows a table of time durations associated with transitions for each processing step in a processing cycle.

FIG. 9 shows an embodiment of a method of controlling a cluster tool apparatus for processing a semiconductor product.

DETAILED DESCRIPTION OF THE PREFERRED EMBODIMENT

The foregoing describes only a preferred embodiment of a cluster tool apparatus, a method of controlling a cluster tool apparatus, and modifications, obvious to those skilled in the art, can be made thereto without departing from the scope of the present disclosure.

Cluster tool apparatuses is a type of integrated equipment that implements semiconductor processing technology. In particular a cluster tool apparatus is an integrated equipment that implements single wafer processing technology. In this disclosure the semiconductor product is a wafer and the present disclosure will refer to a wafer. It should be understood that the cluster tool apparatus may be used to process any other suitable semiconductor product.

Cluster tool apparatuses can provide a flexible, reconfigurable, and efficient environment, resulting in higher productivity, shorter cycle times, better utilization of space and lower capital expenses. Therefore cluster tools are increasingly used in a semiconductor processing method, such as a wafer fabrication process.

Figure 1:
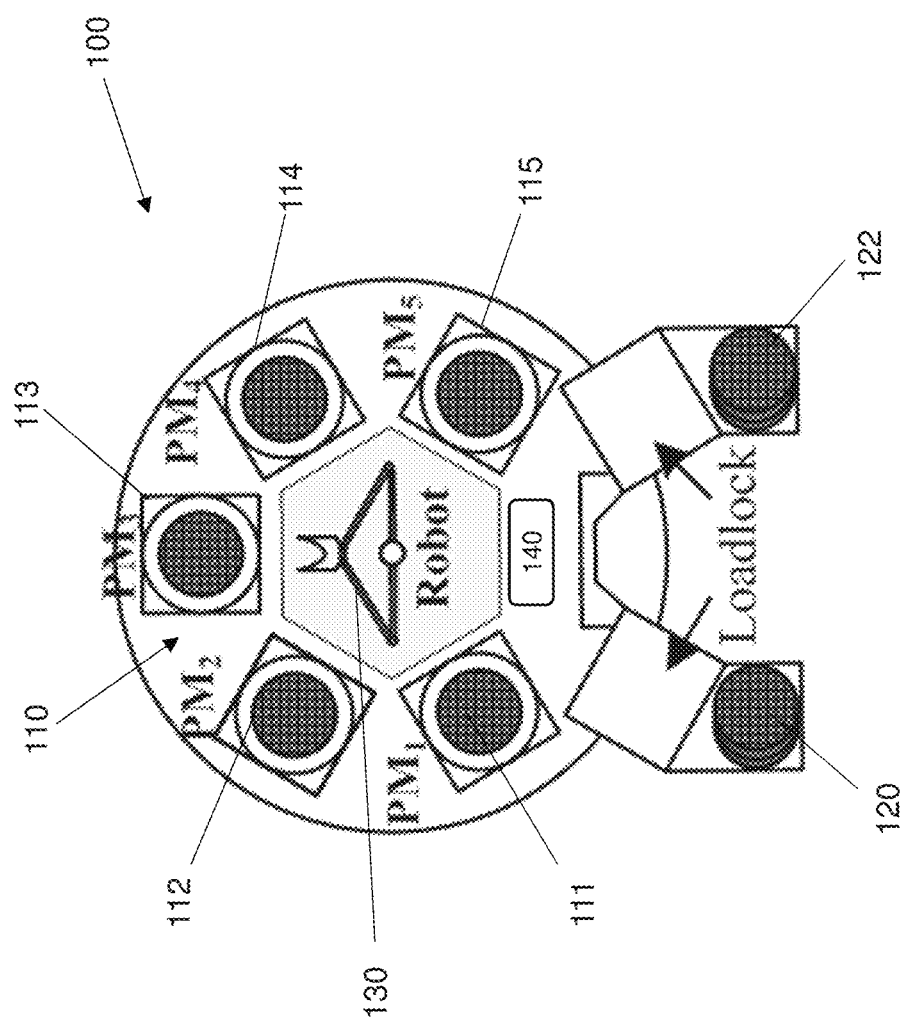
FIG. 1 is a schematic diagram of a single arm cluster tool apparatus that is used in semiconductor product manufacture.

FIG. 1 shows an embodiment of a single arm cluster tool apparatus 100. The cluster tool apparatus 100 comprises one or more processing modules 110, a pair of loadlocks 120, 122 and a single arm robot 130. As shown in FIG. 1 the single arm cluster tool 100 comprises five processing modules 111, 112, 113, 114 and 115 (also referred to as 111-115). The processing modules 111-115 are used in processing the semiconductor product (i.e. wafer). The single arm robot 130 comprises a single robotic arm with a single robotic head. The robotic head comprises an appropriate tool, such as for example jaws, that allow the robotic head to pick up and/or drop off semiconductor products such as silicon wafers. The single arm cluster tool apparatus 100 further includes a user interface 140 such as a touch screen or a screen with associated buttons.

Figure 2:
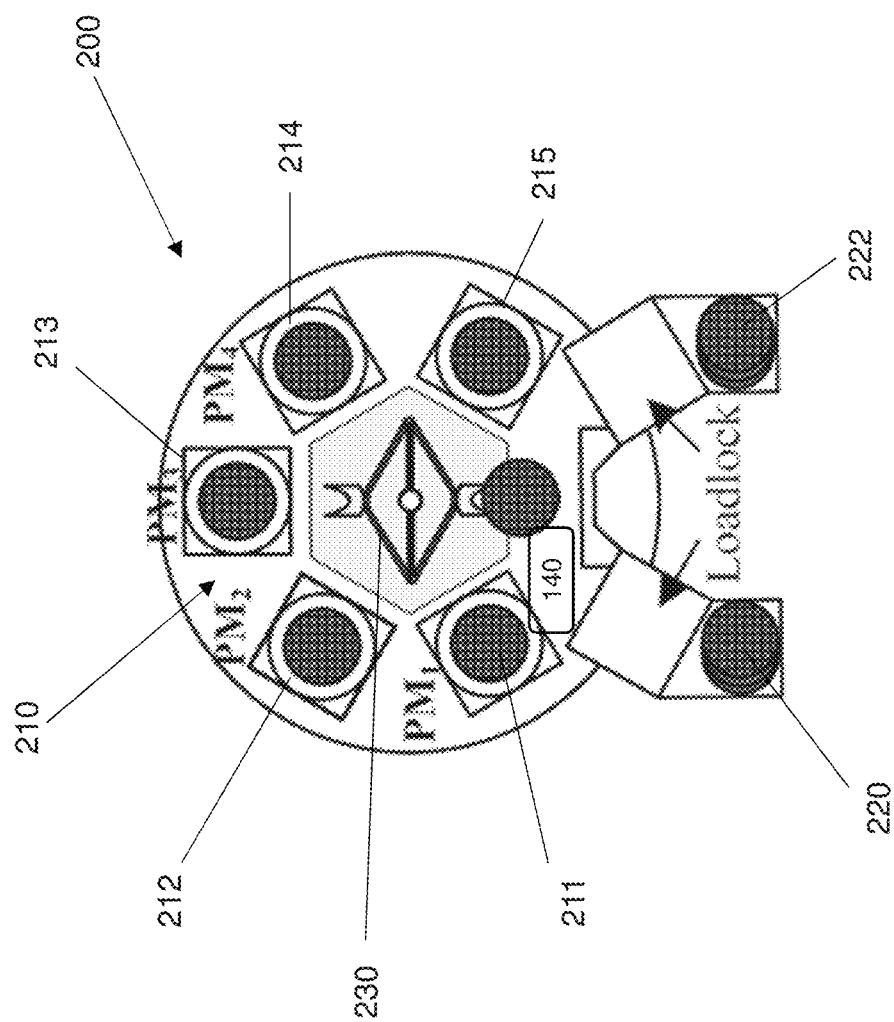
FIG. 2 is a schematic diagram of a dual arm cluster tool apparatus that is used in semiconductor product manufacture.

FIG. 2 shows an embodiment of a dual arm cluster tool apparatus 200. The dual arm cluster tool apparatus 200 comprises one or more processing modules 210, a pair of loadlocks 220, 222 and a dual arm robot 230. As shown in FIG. 2, the dual arm cluster tool 200 comprises five processing modules 211, 212, 213, 214 and 215 (also referred to as 211-215). The processing modules 211-215 are used in processing the semiconductor product (i.e. wafer). The dual arm robot 230 includes two robotic arms and includes two robotic heads that are configured to pick up a semiconductor product (e.g. a wafer) and place the wafer in one of the processing modules 211-215. The dual arm cluster tool apparatus 200 comprises a user interface 240. The user interface 240 may be a touch screen or a screen with a plurality of buttons.

The loadlocks 120, 122 or 220, 222 are used for loading and unloading raw wafers. Raw wafers are loaded or unloaded into a cluster tool in a cassette by a cassette way, and a cassette holds a plurality of wafers. The wafer is transported to an appropriate processing module by the robot 130, 230 for processing, and returned to the loadlock after processing has been completed. Once all the wafers in a cassette have been processed, the cassette is unloaded so that another cassette can be loaded. The order of transporting the wafer to the specific processing modules is dependent on a recipe. At each step the wafer is required to stay within the processing module for a specified time to be processed.

The advantage of using a pair of loadlocks 120, 122 or 220, 222 is advantageous because the cluster tool 100, 200 can operate continuously without interruption. A cluster tool generally operates under a steady state in one of two different regions: a process-bound or transport-bound regions. In the process-bound region or process-bound mode the wafer processing time at PMs decides the cycle time of the system. For a process-bound mode a backward strategy is an optimal strategy for scheduling the operation of a single-arm cluster tool, in particular to control operation of the robot 130.

In the transport-bound region or transport-bound mode the robot task time dominates the cycle time of the apparatus 100, 200. It is desirable to determine a cyclic schedule under a steady state to achieve higher predictability, improved wafer quality and cheaper wafer production. In certain manufacturing processes, such as low pressure chemical vapor deposition (LPCVD), a processed wafer needs to be removed from the processing module within a limited time, otherwise its surface would suffer from severe quality problems due to residual gases and high temperature in a processing module. Such a constraint is referred to as a wafer residency time. The wafer residency time complicates the scheduling of cluster tool operation. In prior art systems various models have been created to model the behavior of cluster tools. These prior art models do not take into account wafer residency time and generally model the cluster tool as a process-bound system. The present disclosure is directed to a method of controlling a cluster tool apparatus based on a model that accounts for wafer residency time and models the cluster tool apparatus as a transport-bound system. The present control method also accounts for the situation where multiple processing modules are required or used for a processing step.

The present disclosure will be described with respect to a single arm cluster tool apparatus 100. The present disclosure discloses a method of controlling a cluster tool apparatus wherein the method comprises the steps of: receiving a plurality of system parameters form a user interface, wherein the system parameters relate to one or more components of the processing cycle, determining a schedule for performing the processing cycle utilizing the one or more processing modules, wherein the schedule being determined based on a semiconductor product residency parameter i.e. a wafer residency time or any other suitable wafer residency parameter. The method of controlling the cluster tool apparatus is based on a model of the cluster tool apparatus and determines an optimal schedule to operate the robot. The schedule outputs at least the robot waiting times and the schedule is based on a number of system parameters. The optimal schedule is derived based on a relationship between the semiconductor residency parameter (i.e. a wafer residency time) and the cycle time of the system. The schedule is obtained by solving a program or a linear program.

Figure 3:
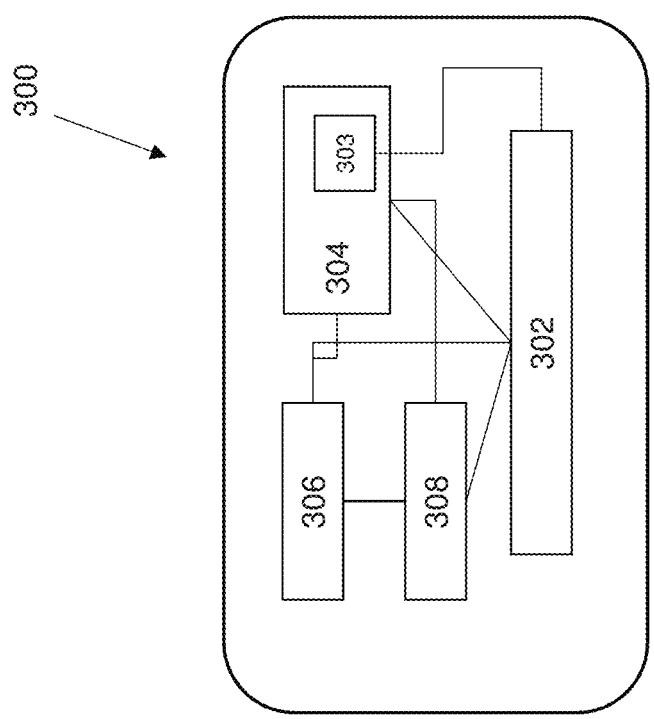
FIG. 3 is a schematic diagram of a controller utilized as part of a cluster tool apparatus.

FIG. 3 shows a schematic of a cluster tool controller 300. The cluster tool 300 comprises a controller that is configured to at least control the robot 130. The controller 300 can be a microcontroller such as for example Intel 8051 or a Freescale 68HC11 or ARM Cortex-M or any other suitable microcontroller. The cluster tool 300 may further be configured to control the operation of the processing modules based on a predetermined program or a predefined process. The controller 300 comprises a processor 302 and a memory unit 304. The processor 302 and memory unit 304 are in electronic communication with each other. The processor 302 can be a suitable processor such as a Motorola or Intel processor. The memory unit 304 can be a suitable RAM or ROM memory. The controller 300 further comprises a commercial solver 303. The commercial solver 303 is stored in the memory unit 304 as a set of executable, computer readable instructions. The commercial solver 303, as shown in FIG. 3, represents a software module 303 that is stored in the memory unit 304 and can be executed by the processor to solve a program (i.e. an algorithm) to generate an optimal schedule and generate at least the robot waiting times for each processing step in a processing cycle. The commercial solver 303 can be any suitable open source such as for example ADMB, LINCOA, OpenMDAO. Alternatively the commercial solver 303 may a proprietary software such as for example AMPL, IOSO, Matlab or N Math.

In a further alternative embodiment the commercial solver 303 may be a hardware module that comprises a suitable processing unit. The commercial solver 303 may be controlled by the processor 302 to solve a program or a linear program to generate a schedule.

The controller 300 may further comprise a robot interface 306 that is in electronic communication with the processor 302. The robot interface 306 is also in communication with the robot 130. In particular the robot interface 306 is in communication with a motor or driver of the robot 130. The robot interface may be a wireless communication module that can wirelessly communicate with a suitable interface in the robot 130 to control operation of the robot. The controller 300 further includes one or more processing module interfaces 308. The processing module interface 308 is configured to communicate with the processing modules 111-115 and control the operation of the processing modules. The processor 302 is further in electronic communication with a user interface to receive inputs from the user. The processor 302 can also output information for display to the user via the user interface 140.

The memory unit 304 stores a mathematical model (described later) of the cluster tool apparatus. The processor 302 is configured to receive a plurality of system parameters such as time units for various actions of the processing cycle via the user interface 140. The processor 302 is further configured to determine a schedule for performing the processing cycle utilizing the one or more processing modules 111-115 and wherein the schedule is determined based on a semiconductor product residency parameter (i.e. a residency time). The processor 302 is configured to determine robot waiting times for processing cycle and uses the robot waiting times to control robot 130 appropriately. The robot waiting time relates to each processing step of the processing cycle.

In an alternative embodiment each processing module may include a processing module interface associated with it, and the processor 302 is configured to communicate with and control each processing module via each processing module interface.

Figure 4:
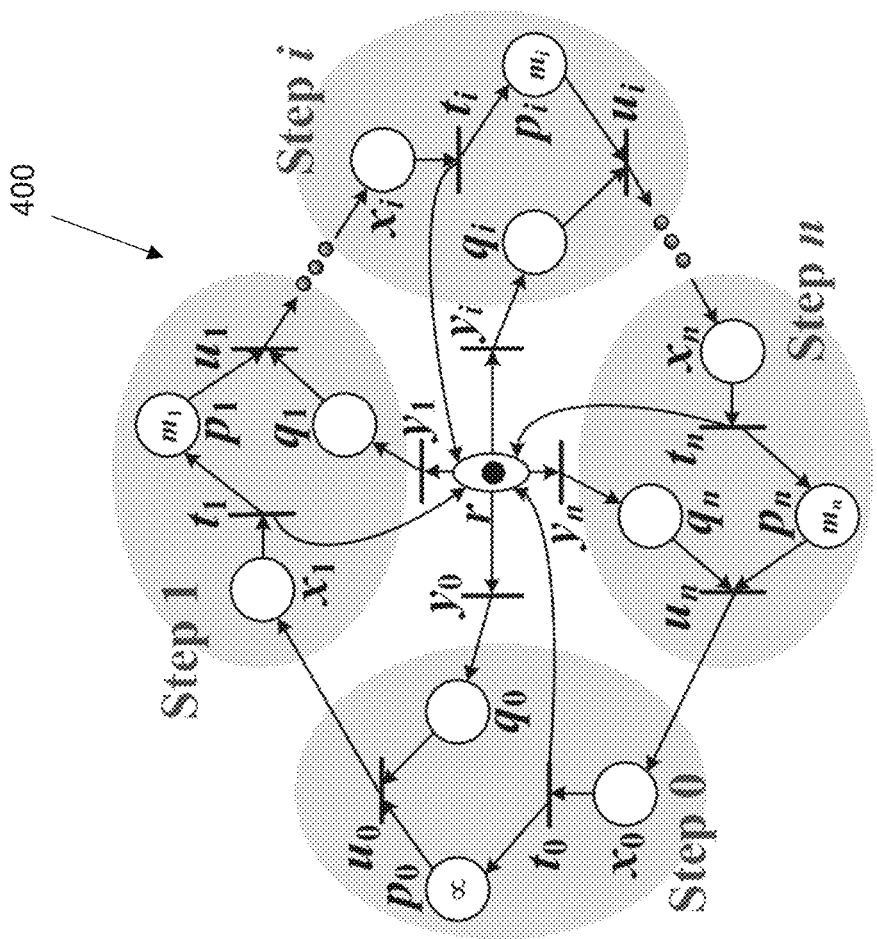
FIG. 4 illustrates a mathematical model used to model the cluster tool apparatus, the mathematical model modelling the transitions and actions for a processing cycle.

The cluster tool apparatus (i.e. cluster tool system) 100 is modelled using a mathematical model. FIG. 4 shows an example of the mathematical model 400 that is used to model the cluster tool apparatus 100. The mathematical model is a Petri Net. A Petri Net model is used since a Petri Net can deal with concurrent activities, and hence it is the best model to use to model a semiconductor processing cycle. Further a Petri Net model is useful at modelling behavior of resource allocation.

At a high level in the Petri Net 400 nodes represent places as circles and transitions as bars. Places and transitions are connected by arcs (i.e. lines). As shown in FIG. 4 Step 0 denotes the loadlocks and r models the robot arm of the cluster tool apparatus 100. Each $p_i$ circle represents a processing module 111-115. Each $q_i$ circle represents the robot waiting before unloading a wafer from $p_i$ and each $x_i$ circle represents robot movement between steps with the robot carrying a wafer. Transitions $u_i$ and $t_i$ models the unloading and loading of wafers (or other semiconductor products) from or into the processing modules 111-115 respectively. $y_i$ models the robot movement between the various steps.

Further details of how the system model is constructed is provided below. The description below explains the assumptions used in the model and explains details of the cluster tool apparatus model. Assume that the loadlocks are numbered as Step 0. Then, there are n+1 steps for the system. For Step i, $i \in \Omega_n = \{0, 1, \ldots, n\}$, its PMs are modeled by timed place $p_i$ with $K(p_i)=m_i$, $i \in N_n = \Omega_n \setminus \{0\}$, and $K(p_0)=\infty$ representing that there are always wafer to be processed in the loadlocks. Timed place $q_i$ with $K(q_i)=1$ models robot's waiting before removing a wafer (token) from $p_i$. Timed place $x_i$, $i \in \Omega_n$, with $K(x_i)=1$ models that the robot moves from Steps i−1 to i (or from Step n if i=0) with a wafer carried. Pictorially, these places are denoted by a circle. Timed transitions $t_i$ and $u_i$ model that the robot drops a wafer into $p_i$ and removes a wafer from $p_i$, respectively. Timed transition $y_i$ models that the robot moves from Steps j to i, j, $i \in \Omega_n$, without carrying a wafer. Pictorially, transitions are denoted by a bar. Place r with $K(r)=1$ models the robot and it is denoted by an ellipse. If there is a token in r, the robot is available and can be used to unload a wafer. An arc $(t_i, r)$, $i \in \Omega_n$, is added to represent that, by firing $t_i$ (loading a wafer into $p_i$), the robot arm is released. At last, by adding arcs $(x_i, t_i)$, $(t_i, p_i)$, $(p_i, u_i)$, $(q_i, u_i)$, and $(u_i, x_{i+1})$ (or $(u_n, x_0)$ if i=n), $i \in \Omega_n$, the PN model for the system is obtained as shown in FIG. 4.

A basic activity sequence for the Petri Net model 400 is defined as $A_i = \langle y_i \to u_i \to x_{i+1} \to t_{i+1}$ (i+1=0 if i=n)$\rangle$, $i \in \Omega_n$. Note that if $t_i$ is followed by $y_i$ and $y_i$ represents that the robot moves from Step i to i, or it takes no action if $m_i=1$. Otherwise, if $m_i > 1$, it also needs to take a time for moving from one module to another within Step i. Then, without taking the robot waiting into account, $\eta = (A_{i_0} A_{i_1} A_{i_n})$ can be used to describe a scheduling strategy for the system, where $i_0, i_1, \ldots,$ and $i_n$ denote a permutation of steps $\{0, 1, 2, \ldots, n\}$. It is assumed that $\eta$ begins with unloading a wafer from Step 0. Thus, the following condition $A_{i_0} = A_0$ is always true, unless otherwise specified.

It is assumed that a one-wafer cycle (i.e. a one processing cycle) is a sequence of activities with each basic activity $A_i$, $i \in \Omega_n$, appearing just once and during which one semiconductor product (e.g. a wafer) is dropped into and removed from the loadlocks 120, 122. The processing cycle time (i.e. system cycle time) is the minimal time needed to complete the one wafer cycle. The processing cycle time (i.e. a system cycle time) is a parameter that should be reduced or minimized in order to achieve optimal and cost effective semiconductor product (i.e. wafer) processing.

It is further assumed for the mathematical model in a scheduling strategy $\eta$, an activity chain is a sequence of activities whose indexes appear with a consecutively increasing order, but not necessary adjacently. An example scheduling strategy can be defined as $\eta = (A_0 A_4 A_5 A_1 A_2 A_3)$. Based on the above assumption, $A_0$ and $A_1 A_2 A_3$ form an activity chain although $A_0$ and $A_1 A_2 A_3$ are separated by $A_4 A_5$. Also, $A_4 A_5$ forms an activity chain. Hence, there are two activity chains in $\eta = (A_0 A_4 A_5 A_1 A_2 A_3)$.

It is further assumed for the mathematical model and control method of the present disclosure that only one wafer should be in processing during the whole cycle. If an optimal scheduling strategy is applied and it is schedulable, the maximum productivity can be achieved by using the model that works on the assumption that only one wafer is used in the processing cycle. Let D be the set of indexes of an activity chain in $\eta$ and, given a D, let $i = \text{Min}\{D\}$. Then, the initial marking is set as follows. For each activity chain in $\eta$, find D and set $M_0(p_i)=m_i$, $i \in D\setminus\{0\}$, $M_0(p_j)=m_j-1$, $j \in D\setminus\{0, i\}$; $M_0(p_0)=\infty$ indicating that there are always wafers to be processed in the loadlocks; $M_0(r)=0$; $M_0(x_i)=0$, $i \in \Omega_n$; $M_0(q_j)=0$, $j \in N_n$; and $M_0(q_0)=1$, indicating that the robot is waiting at Step 0 for unloading a wafer there.

Take the scheduling strategy $\eta=(A_0A_5A_3A_4A_1A_2)$ as an example, there are three activity chains: 1) $A_0A_1A_2$; 2) $A_5$; and 3) $A_3A_4$. For Chain 1, D={0, 1, 2}, the minimal one is 0. Thus, $M_0(p_0)=\infty$, $M_0(p_1)=m_1-1$, and $M_0(p_2)=m_2-1$. For Chain 2, D={5} and set $M_0(p_5)=m_5$. For Chain 3, D={3, 4} and Min{3, 4}=3. Thus, set $M_0(p_3)=m_3$, and $M_0(p_4)=m_4-1$. Then, set $M_0(r)=0$, $M_0(x_i)=0$, $i\in\Omega_n$. Finally, set $M_0(q_j)=0$, $j\in\mathbb{N}_n$, and $M_0(q_0)=1$.

At $M_0$, as $M_0(r)=0$; $M_0(x_i)=0$, $i\in\Omega_n$; $M_0(q_j)=0$, $j\in\mathbb{N}_n$; and $M_0(q_0)=1$; the only enabled transition is $u_0$. After $u_0$ fires, the robot performs task sequence: $<x_1 \to t_1>$ to load a wafer into Step 1 such that $M_1$ is reached, and at $M_1$, $M_1(p_1)=m_1$. Thereafter, the robot may execute the following task sequence: $<y_0 \to q_0 \to u_0 \to x_1>$ to load a wafer into Step 1 again. As $M_1(p_1)=m_1$, from the transition enabling and firing rules, a deadlock occurs. To avoid deadlock, the following control policy is proposed. For the Petri Net of the system, given a strategy $\eta=(A_{i_0} A_{i_1} \ldots A_{i_n})$, at marking M, $y_{i_j}$, $j\in\mathbb{N}$, is said to be control-enabled if $t_{(i_{j-1})+1}$ (if $i_{j-1}$ is n, $(i_{j-1})+1$ should be replaced by 0) has just executed; $y_{i_0}$ (or $y_0$) is said to be control-enabled if $t_{(i_n)+1}$, (if $i_n$ is n, $(i_n)+1$ should be replaced by 0) has just executed.

Based on the above definition at $M_0$, after $u_0$ fires, the robot performs task sequence $<x_1 \to t_1 \to y_{i_1} \to u_{i_1} \to x_{(i_1)+1} \to t_{(i_1)+1} \to y_{i_2} \to u_{i_2} \to x_{(i_2)+1} \to t_{(i_2)+1} \to y_{i_3} \to u_{i_3} \to \ldots \ldots u_{i_n} \to x_{(i_n)+1} \to t_{(i_n)+1} \to y_{i_0}(y_0) \to u_0 \to x_1>$ such that a cycle is completed and there is no deadlock. In this way, the PN model is made deadlock-free.

The various transitions and places represented in the Petri Net model 400 are associated with an amount of time units. In the model 400 if a transition t is associated with time $\varsigma$, it means that firing t lasts for $\varsigma$ time units. If place p is associated with time $\varsigma$, it implies that a token in p has to stay there for at least $\varsigma$ time units before it can enable its output transition. Token p represents a semiconductor product i.e. a wafer. It is assumed that: 1) the time taken for the robot to unload/load a wafer from/into a PM and loadlocks is identical and denoted by $\lambda$, and 2) the time taken for the robot to move from Steps j to i, j≠i, is same no matter whether it carries a wafer or not and denoted by $\mu$. The time required to process a wafer at Step i is $\alpha_i$, $i\in\Omega_n$, with $\alpha_0=0$. $\omega_i$, $i\in\Omega_n$, denotes the robot waiting time in $q_i$, and $\tau_i$, $i\in\mathbb{N}_n$, the wafer sojourn time at Step i. After being processed, a wafer needs to be removed from a PM at Step i within a limited time $\delta_i$, $i\in\mathbb{N}_n$, we have $\tau_i\in[\alpha_i, \alpha_i+\delta_i]$. In the loadlocks, there are no wafer processing and thus there is no wafer residency time constraint.

If activity sequence $A_{i-1}A_i/A_nA_0$ is an item in $\eta$, after loading a wafer into $p_i/p_0$, the robot needs to wait there for at least $\alpha_i$ time units if $m_i=1$, $i\in\mathbb{N}_n$, and then unloads a wafer from $p_i/p_0$. This implies that $y_i/y_0$ takes no time. However, if $m_i>1$, after loading a wafer into Step i, the robot needs to move to a parallel module at Step i for unloading the earliest wafer. Hence, in this case, $y_i$ takes $\mu$ time units. Note that, for $\eta=(A_0 A_{i_1} \ldots A_{i_n})$, as it can be equivalently denoted as $\eta=(A_{i_1} \ldots A_{i_n} A_0)$, $A_nA_0$ is an item in $\eta$.

The time taken for different transitions and places are modelled and defined in table 500, as shown in FIG. 5. FIG. 5 includes a mathematical definition for each transition of the wafer processing cycle, and each step and transition (i.e. action) of the wafer processing cycle is defined as a time unit. The model further determines the feasibility of the determined schedule. In order to determine feasibility of a schedule the following assumption is used. Given wafer residency time interval $[\alpha_i, \alpha_i+\delta_i]$ for Step i, $i\in\mathbb{N}_n$, by the PN model, a schedule is feasible if whenever $u_i$ is enabled and fired, the following condition is true $\alpha_i\leq\tau_i\leq\alpha_i+\delta_i$.

Timeliness analysis of the system is performed by modelling the cycle time (of the processing cycle), robot cycle time and step cycle using the variables from Table 500 of FIG. 5. Details of the timeliness analysis are provided below.

An optimal scheduling strategy is determined based on the mathematical definitions below. Given a scheduling strategy $\eta=(A_{i_0} A_{i_1} \ldots A_{i_n})$, define $\Lambda^P=\{i|(A_{i-1}A_i)\not\subseteq\eta$ and $i\in\mathbb{N}_n\}\cup\{0|(A_nA_0)\not\subseteq\eta\}$ and $\Lambda^R=\{i|(A_{i-1}A_i)\subseteq\eta$ and $i\in\mathbb{N}_n\}\cup\{0|A_nA_0) \subseteq\eta\}$. For $\eta=(A_0 A_{i_1} \ldots A_n)$, since it is equivalent to $\eta=(A_n A_0)$, $0\in\Lambda^R$ is also true. The mean of $\Lambda^P$ and $\Lambda^R$ can be explained as follows. If an $i\in\Lambda^P$, after the robot loads a wafer into Step i, it should go to another step for unloading a wafer, while if an $i\in\Lambda^R$, after the robot loads a wafer into Step i, it should wait there for a wafer to be completed, instead of moving to another step for unloading a wafer if $m_i=1$, $i\in\mathbb{N}_n$. If $0\in\Lambda^R$, after loading a wafer into the loadlocks, the robot can unload a wafer there immediately. However, in this case, if $m_i>1$, $i\in\mathbb{N}_n$, after loading a wafer into Step i, the robot should move to a parallel module at Step i that is processing the earliest wafer that is loaded into this step for unloading it. To ease the presentation, basic cycles are defined as follows.

Definition 3.1: For a single arm cluster tool apparatus, a robot schedule whose activity indexes are in a decreasing order except those in $\Lambda^R$ forms a basic cycle.

For example, for a scheduling strategy, $\eta=(A_0A_1A_2A_3A_4)$ forms a basic cycle, since it is equivalent to $A_3A_4A_0A_1A_2$ and $\Lambda^R=\{1, 2, 4\}$ such that the condition described in Definition 3.1 is met. However, a scheduling strategy $\eta=(A_0A_2A_1A_4A_3)$ does not form a basic cycle. A basic cycle dominates all other one-wafer cycle in terms of having shorter cycle time.

Lemma 3.1: For the following three cases, we have
a): If $|D_s|=0$, $(A_0A_1A_2A_3\ldots A_n)$ is the optimal one-wafer scheduling strategy;
b): If $|D_s|\geq 2$, there exists an optimal basic cycle in which all $D_s \in \Lambda_P$;
c): If $|D_s|=1$, let $\alpha_q\geq\mu$ and $\alpha_k=\max\{\alpha_j: j\in n\backslash\{q\}\}$. If $\alpha_q+\alpha_k\leq 2\mu$, then $(A_0A_1A_2A_3 \ldots A_n)$ is the optimal one-wafer scheduling strategy. If $\alpha_q+\alpha_k>2\mu$, there is an optimal basic one-wafer cycle in which $q\Sigma\Lambda^P$.

The above explanation of the model is created on the assumption that there is one processing module per processing step of the processing cycle. Now assume that there are parallel processing modules in each step, wherein Step i and $i\in\Lambda^R$. After loading a wafer (i.e. a semiconductor product) into Step i, the robot 130 moves to an associated processing module 111-115 in Step i that is processing the earliest wafer loaded into this step for unloading this wafer, which takes $\mu$ time units. Further, if this wafer has not been completed yet, the robot should wait $\omega_i$ time units. Hence, by treating Step i as a whole, $i\in D_s$. Then, with no wafer residency time constraint being taken into account, the controller 300 may or alternatively the optimal scheduling strategy is analyzed for a single-arm cluster tool with parallel modules as follows.

Case 1: There is no parallel PM. For such a case, an optimal scheduling strategy can be found, as disclosed above or based on a well known method such as disclosed in Dawande et al, 2002.

Case 2: There are parallel PMs and $\exists k\in\{i|m_i=1\}$ with $\alpha_k\geq\mu$. In this case, $|D_s|\geq 2$, and from Lemma 3.1, for Steps i with parallel PMs, it must have $i\in\Lambda^P$. Then, the optimal scheduling strategy is obtained for the whole system by a polynomial time algorithm. In one embodiment the polynomial time algorithm can be derived in Dawande et al, 2002.

Case 3: There are parallel PMs and for all $k \in \{i|m_i=1\}$, $\alpha_k < \mu$. In this case, there are still two cases, i.e., Case 3.1: There are at least two steps where there are parallel PMs; and Case 3.2: there is only one step where there are parallel PMs. For Case 3.1, similar to Case 2, since $|D_s| \geq 2$, for Steps i with parallel PMs, $i \in \Lambda^P$. Thus, an optimal scheduling strategy for the whole system can be determined based on the method in Dawande et al., 2002.

For Case 3.2, let q denote the step with $m_q$ parallel PMs and assume that there are $m_q-1$ wafers being processed in PMs 1, 2, . . . , and $m_q-1$, respectively. Under scheduling strategy $(A_0A_1A_2A_3 \ldots A_n)$, after loading a wafer into the $m_q$th PM, the robot moves to the 1th PM, and wait $\omega_q$ time units if necessary. Thereafter, it unloads this wafer, moves to Step q+1 or 0 if q=n, and loads the wafer into it. These activities take $2\lambda+\mu+(\omega_q+\mu)$ time units. After loading a wafer into Step q+1 (or 0), activity sequence <processing in Step q+1 (or 0)→unloading from it→moving to Step q+2 or 0 if q-1=n→loading the wafer into it> is followed and it takes $2\lambda+\mu+\alpha_{q+1}$ (or $2\lambda+\mu+\alpha_0$ if q=n) time units. Similarly, from the loading of a wafer into Step q+2 to the loading of a wafer into Step q+3, $2\lambda+\mu+\alpha_{q+2}$ (or $2\lambda+\mu+\alpha_0$ if q-1=n) time units are taken. In this way, after a cycle, when the robot loads a wafer into the 1th PM of Step q, it is true that such a cycle takes $\chi$ time units where $$\chi = \sum_{i=1}^{n} \alpha_i - \alpha_q + (n+1)(2\lambda + \mu) + \mu + \omega_q. \quad (3.1)$$

Let $\sigma_1$ denote the time instant of loading a wafer into the $m_q$th PM at Step q. From $\sigma_1$, after $m_q-1$ cycles, the robot loads a wafer into the $(m_q-1)$th PM at Step q. Then, the robot moves to the $m_q$th PM at Step q for unloading a wafer there and let $\sigma_2$ denote this time instant. From above analysis, it can be seen that $\sigma_2-\sigma_1=(m_q-1)\times\chi+\mu$. If $\alpha_q \leq \sigma_2-\sigma_{-1}$, before the robot comes to the $m_q$th PM at Step q, the wafer in it has completed its processing, hence, $\omega_q=0$. However, if $\alpha_q > \sigma_2-\sigma_1$, the wafer in it has not been completed yet, and $\omega_q = \alpha_q - [(m_q-1)\times\chi+\mu]$. Such a result can be expressed as:

$$\omega_q = \begin{cases} 0, & \text{if } \alpha_q \leq (m_q-1) \times \chi + \mu; \\ \alpha_q - [(m_q-1) \times \chi + \mu], & \text{if } \alpha_q > (m_q-1) \times \chi + \mu. \end{cases} \quad (3.2)$$

By 3.1 and 3.2 the wait time units are determined. Specifically, the first assumption is that $\omega_q = \alpha_q - [(m_q-1)\times\chi+\mu]$. Then, the value of $\omega_q$ can be obtained. Next, check whether $\alpha_q > (m_q-1)\times\chi+\mu$ holds or not with the obtained $\omega_q$. If not, reset $\omega_q=0$, or otherwise the obtained value is true. Then, similar to Lemma 3.1, the optimal scheduling strategy for Case 3.2 can be determined as follows. Let $\alpha_k = \max\{\alpha_j, j \in n \setminus \{q\}\}$. If $(\mu+\omega_q)+\alpha_k \leq 2\mu$, $(A_0A_1A_2A_3 \ldots A_n)$ is the optimal one-wafer scheduling strategy. If $(\mu+\omega_q)+\alpha_k \geq 2\mu$, there is an optimal basic one-wafer cycle in which $q \in \Lambda^P$. Then, by following a known polynomial algorithm, an optimal scheduling strategy for the whole system can be determined. In one example the polynomial algorithm can be one as developed in Dawande et al 2002.

The above disclosure of the model and scheduling strategy development disclosure has worked on the assumption without a semiconductor product residency parameter (i.e. a wafer residency time). From the above analysis, for Cases 2 and 3.1, all the steps with parallel processing modules 111-115, belong to $\Lambda^P$. For Case 3.2, if $(\mu+\omega_q)+\alpha_k \geq 2\mu$, we still have $q \in \Lambda^P$. However, if $(\mu+\omega_q)+\alpha_k \leq 2\mu$, to check the feasibility, we only need to check whether $\sigma_2-\sigma_1 \leq \alpha_q+\delta_q$ holds or not. If yes, $(A_0A_1A_2A_3 \ldots A_n)$ is an optimal and feasible schedule, otherwise the wafer in Step q violates the semiconductor product residency parameter i.e. a wafer residency time constraint. In the following discussion, we assume that an optimal scheduling strategy is determined and for feasibility, Cases 1, 2 and 3.1 are analyzed, and the situation where $(\mu+\omega_q)+\alpha_k \geq 2\mu$ for Case 3.2. For all cases, steps with parallel processing modules belong to $\Lambda^P$.

Below is a discussion of the timeliness analysis that is performed of the system to develop a schedule. The timeliness analysis may be pre-performed and the result of the timeliness analysis may be stored in the memory unit 304. Alternatively the processor 302 may be configured to conduct the timeliness analysis in real time as part of determining the optimal scheduling strategy.

Given a scheduling strategy $\eta=(A_{i_0}A_{i_1} \ldots A_{i_n})$, a wafer processing cycle at Step i is formed by the activity sequence from $A_i$ to $A_{i-1}$, i.e., $(A_i \, A_{j_1} \, A_{j_2} \ldots A_{j_m} \, A_{i-1})$, where $(j_1, j_2, \ldots j_m)$ are the indexes of activities between i and i−1 under $\eta$. For example, given $\eta=(A_0A_5A_3A_4A_1A_2)$, $A_1A_2A_0$ forms such a cycle at processing Step 0, while $A_5A_3A_4$ forms a cycle at processing Step 5 of the processing cycle. In a robot cycle, all activities in $\eta$ should be performed once. Note that processing step may be referred to as "step" for ease of explanation.

$IA(PS_i)$ and $IA(R)$ are used to denote the index sets of activities in the wafer processing cycle at processing Step i and robot cycle, respectively, i.e., $IA(PS_i)=\{i, j_1, j_2, \ldots j_m, i-1\}$ and $IA(R)=\{i_0, i_1, i_2, \ldots i_n\}$. $|IA(PS_i)|$ and $|IA(R)|$ denote the cardinality of $IA(PS_i)$ and $IA(R)$. Furthermore, for $i \in \Omega_n$, let $\omega_i = \omega^*_i + \alpha_i$ if $i \in \Lambda^R$, and $\omega_i = \omega^*_i$ if $i \in \Lambda^P$.

The time taken for a wafer at Step i is analyzed. To satisfy the wafer residency time constraint at Step i, $\tau_i \in [\alpha_i, \alpha_i+\delta_i]$, $i \in N_n$, must hold. When $\tau_i = \alpha_i$, the allowed shortest wafer processing cycle time at Step i is reached and we use $\theta_{iS}$ to denote it; while $\tau_i = \alpha_i + \delta_i$, the allowed longest time to complete a wafer at Step i is reached and we use $\theta_{iL}$ to denote it. We first discuss how to calculate $\theta_{iS}$.

If $|IA(PS_i)|=2$, we have $IA(PS_i)=\{i, i-1\}$, $i \in N_n$, or $IA(PS_0)=\{0, n\}$. In this case, to complete a wafer at Step i, $i \in N_n$, task sequence (firing $t_i$ ($\lambda$ time units)→processing a wafer at Step i ($\alpha_i$)→firing $u_i$ ($\lambda$)→$x_{i+1}$ ($\mu$)→$t_{i+1}$ ($\lambda$)→$y_{i-1}$ ($\mu$)→waiting in $q_{i-1}$ ($\omega^*_{i-1}$)→$u_{i-1}(\lambda)$→$x_i(\mu)$→firing $t_i$ again> is performed, which takes $\alpha_i+4\lambda+3\mu+\omega^*_{i-1}$ time units. Consider that there are $m_i$ parallel PMs at Step i and all the steps with parallel PMs belong to $\Lambda^P$, we have $\theta_{iS}=(\alpha_i+4\lambda+3\mu+\omega^*_{i-1})/m_i$, $i \in N_n$. Similarly, we have $\theta_{0S}=(\alpha_0+4\lambda+3\mu+\omega^*_n)/m_0$, where $m_0=1$ is set, since the loadlocks has no wafer processing function and there is no wafer residency time constraint. Thereafter, we always set $m_0=1$. m is the number of parallel processing modules.

If $|IA(PS_i)|=3$, we have $IA(PS_i)=\{i, m, i-1\}$, $i \in N_n$, or $IA(PS_0)=\{0, m, n\}$. For that case of $IA(PS_i)=\{i, m, i-1\}$, if $m \in \Lambda^R$ and $(i-1) \in \Lambda^P$, let $\varsigma_1$ denote the time instant when $A_i$ has just been performed, i.e., $t_{i+1}$ (or $t_m$) finishes its firing at $\varsigma_1$. As $m \in \Lambda^R$, $y_m$ takes no time and the robot waits for $(\alpha_m+\omega^*_m)$ time units at $p_m$. Then, the robot unloads a wafer there by firing $u_m$, moves to Step m+1 and loads the wafer into the step by firing $x_{m+1}$ and $t_{m+i}$. Let $\varsigma_2$ denote the time instant when $t_{m+1}$ finishes its firing. Then, we have $\varsigma_2 - \varsigma_1 = 2\lambda+\mu+(\alpha_m+\omega^*_m)$. By starting from $\varsigma_2$, activity sequence <firing $y_{i-1}$ ($\mu$) (since $(i-1) \in \Lambda^P$)→waiting in $q_{i-1}$ ($\omega^*_{i-1}$)→$u_{i-1}(\lambda)$→($\mu$)→$t_i$ ($\lambda$)→processing a wafer at Step i ($\alpha_i$)→$u_i(\lambda)$→$x_{i+1}(\mu)$→$t_{i+1}(\lambda)$> is performed such that a wafer processing cycle at $PS_i$ is completed. Let $\varsigma_3$ denote the time instant when $t_{i+1}$ finishes its firing again. Then, $\varsigma_3 - \varsigma_2 = \alpha_i + 4\lambda + 3\mu + \omega^*_{i-1}$. Thus, we have $\theta_{iS} = (\varsigma_3 - \varsigma_1)/m_i = (\alpha_i + 4\lambda + 3\mu + \omega^*_{i-1} + 2\lambda + \mu + \alpha_m + \omega^*_m)/m_i$.

If $m \in \Lambda^P$ and $(i-1) \in \Lambda^R$. Let $\varsigma_1$ and $\varsigma_2$ denote the time instant when $t_{i+1}$ and $t_{m+1}$ finish their firing. As $m \in \Lambda^P$, $y_m$ takes $\mu$ time units and we have $\varsigma_2 - \varsigma_1 = 2\lambda + 2\mu + \omega^*_m$. Let $\varsigma_3$ denote the time instant when $t_{i+1}$ finish its firing again. As $y_{i-1}$ takes no time for this case, from the above analysis, we have $\varsigma_3 - \varsigma_2 = \alpha_i + 4\lambda + 2\mu + \alpha_{i-1} + \omega^*_{i-1}$. Thus, we have $\theta_{iS} = (\varsigma_3 - \varsigma_1)/m_i = (\alpha_i + 4\lambda + 2\mu + \alpha_{i-1} + \omega^*_{i-1} + 2\lambda + 2\mu + \omega^*_m)/m_i$.

By the above analysis, if one basic activity $A_m$ is added, $\theta_{iS}$ increases $(2\lambda + 2\mu + \omega_m)/m_i$ time units, where $\omega_i = \omega^*_i + \alpha_i$ if $i \in \Lambda^R$, and $\omega_i = \omega^*_i$ if $i \in \Lambda^P$. Meanwhile, in $IA(PS_i) \setminus \{i\}$, if the number of indexes that belong to $\Lambda^R$ increases by one, $\theta_{iS}$ decreases $\mu/m_i$ time units. Hence, we can calculate $\theta_{iS}$ for the cases of $|IA(PS_i)| \in \{4, 5, 6, \ldots, n+1\}$. To ease the presentation, let $Q(PS_i) = \{IA(PS_i) \setminus \{i\}\} \cap \Lambda^R$ and $R(PS_i) = \{IA(PS_i) \setminus \{i\}\} \cap \Lambda^P$, and $|Q(PS_i)|$ and $|R(PS_i)|$ denote their cardinalities. Then, we have the allowed shortest cycle time at Step i is $$\theta_{iS} = (\alpha_i + 4\lambda + 3\mu + 2 \times (|IA(PS_i)| - 2) \times (\lambda + \mu) + (\Sigma_{m \in Q(PS_i)}(\alpha_m + \omega^*_m) + \Sigma_{m \in R(PS_i)} \omega^*_m) - |Q(PS_i)| \times \mu)/m_i \quad (3.3)$$

The longest wafer processing cycle time is $$\theta_{iL} = (\alpha_i + \delta_i + 4\lambda + 3\mu + 2 \times (|IA(PS_i)| - 2) \times (\lambda + \mu) + (\Sigma_{m \in Q(PS_i)})(\alpha_m + \omega^*_m) + \Sigma_{m \in R(PS_i)} \omega^*_m) - |Q(PS_i)| \times \mu)/m_i. \quad (3.4)$$

Expressions (3.3)-(3.4) present the feasible cycle time range or workload range for Step i, $i \in \mathbb{N}_n$. By removing $\Sigma_{m \in Q(PS_i)} \omega^*_m$ and $\Sigma_{m \in R(PS_i)} \omega^*_m$ from (3.3)-(3.4), we have the shortest and longest "natural workload" [Wu et al., 2008] for Step i as follows:

$$\xi_{iS} = (\alpha_i + 4\lambda + 3\mu + 2 \times (|IA(PS_i)| - 2) \times (\lambda + \mu) + \Sigma_{m \in Q(PS_i)} \alpha_m - |Q(PS_i)| \times \mu)/m_i. \quad (3.5)$$

$$\xi_{iL} = (\alpha_i + \delta_i + 4\lambda + 3\mu + 2 \times (|IA(PS_i)| - 2) \times (\lambda + \mu) + \Sigma_{m \in Q(PS_i)} \alpha_m - |Q(PS_i)| \times \mu)/m_i. \quad (3.6)$$

Natural workload plays an important role in schedulability analysis, since it provides the workload balance information among the processing steps of the processing cycle. To explain further mathematically let $\theta_i = (\tau_i + 4\lambda + 3\mu + 2 \times (|IA(PS_i)| - 2) \times (\lambda + \mu) + \Sigma_{m \in \{IA(PS_i) \setminus \{i\}\}} \omega_m - |Q(PS_i)| \times \mu)/m_i$, $i \in \Omega_n$, denote the cycle time for Step i. By comparing $\theta_i$ with $\xi_i = (\tau_i + 4\lambda + 3\mu + 2 \times (|IA(PS_i)| - 2) \times (\lambda + \mu) + \Sigma_{m \in Q(PS_i)} \alpha_m - |Q(PS_i)| \times \mu)/m_i$, we conclude that if $\theta_i = \xi_i$, the $\tau_i$ in $\xi_i$ is greater than or equal to that in $\theta_i$, since $\Sigma_{m \in \{IA(PS_i) \setminus \{i\}\}} \omega_m = \Sigma_{m \in Q(PS_i)} \alpha_m + \Sigma_{m \in Q(PS_i)} \omega^*_m + \Sigma m \in R(PS_i) \omega^*_m \geq \Sigma_{m \in Q(PS_i)} \alpha_m$.

The above expression shows that, by adjusting the robot waiting time, the system is scheduled to balance the workloads among the steps (i.e. processing steps) to some extent to make the wafer residency time constraint (i.e. semiconductor product residency parameter) is satisfied. The controller 300 may be configured to determine a robot cycle time that balances the workload by performing the steps disclosed herein. The mathematical expressions may be programmed as a computer executable method.

It is desirable to calculate the time to process at each processing module, $\tau_i$ that is dependent on the robot cycle time $\psi$. Determining robot cycle time is explained below. There must be at least one $i \in \Lambda^R$. Let $\psi^*$ be the robot cycle time under the assumption that $\omega^*_m = 0$, $m \in \Omega_n$. Therefore $\psi^*$ is equal to $\xi_{iS}$, $i \in \Lambda^R$, or alternatively;

$$\psi^* = (\alpha_i + 4\lambda + 3\mu + 2 \times (|IA(PS_i)| - 2) \times (\lambda + \mu) - |Q(PS_i)| \times \mu + \Sigma_{m \in Q(PS_i)} \alpha_m)/m_i, i \in \Lambda^R. \quad (3.7)$$

Let $\Pi = \max\{\xi_{0S}, \xi_{1S}, \xi_{2S}, \ldots, \xi_{nS}, \psi^*\}$. Then, $\Pi$ must be the lower bound of cycle time for a transport-bound single-arm cluster tool. Since $\psi^* = \xi_{iS}$, $i \in \Lambda^R$, $\Pi = \max\{\xi_{0S}, \xi_{1S}, \xi_{2S}, \ldots, \xi_{nS}\}$ must hold. Using cycle time $\Pi$ (i.e. a processing cycle time), any feasible schedule that is determined is an optimal schedule. The schedule can be determined by the controller 300 and the schedule is used to control the robot arm 130. $\Pi$ denotes the cycle time of the system i.e. the time to complete a processing cycle.

With $\theta_i$, $i \in \Omega_n$, being the cycle time of Step i, in the steady state, each step has the same cycle time that should be equal to the robot cycle time and the system cycle time. This is defined in the expression below.

$$\Pi = \theta_0 = \theta_1 = \ldots = \theta_n = \psi. \quad (3.8)$$

Based upon (3.8), the robot cycle time can be determined as $$\psi = \Pi = \theta_i = (\tau_i + 4\lambda + 3\mu + 2 \times (|IA(PS_i)| - 2) \times (\lambda + \mu) + \Sigma_{m \in \{IA(PS_i) \setminus \{i\}\}} \omega_m - |Q(PS_i)| \times \mu)/m_i, i \in \Omega_n. \quad (3.9)$$

By (3.9), in the steady-state, the wafer sojourn time $\tau_i$ in $p_i$, $i \in \mathbb{N}_n$, is $$\tau_i = m_i \times \Pi - [4\lambda + 3\mu + 2 \times (|IA(PS_i)| - 2) \times (\lambda + \mu) + \Sigma_{m \in \{IA(PS_i) \setminus \{i\}\}} \omega_m - |Q(PS_i)| \times \mu] \quad (3.10)$$

With (3.10), once $\omega_i$, $i \in \Omega_n$, is determined, $\tau_i$, $i \in \mathbb{N}_n$, can be calculated. Expression 3.8 is an important conclusion which indicates that the system cycle time (i.e. processing cycle time) should be equal to the robot cycle time results in an optimal schedule.

It follows that from expression 3.8, that to schedule the cluster tool apparatus 100 is to allocate the robot 130 waiting time such that the semiconductor residency parameter (wafer residency time) is satisfied. Three algorithms can be used by the processor 302 to set robot waiting times and generate a schedule to control the operation of the robot arm 130. The three algorithms are in the form of three programs (with one program and two linear programs) that can be solved to determine robot waiting times and obtain a schedule. In particular the algorithms (referred to as linear programs herein) are stored on the memory unit 304, and executed by the processor 302. The linear programs are stored as computer readable and executable instructions that are configured to be executed by the processor 302.

The algorithms are based on the proposition that the cluster tool apparatus, with a semiconductor residency parameter (i.e. a wafer residency time), is schedulable with an optimal scheduling strategy, if the robot cycle time $\psi$ equals the system cycle time $\Pi$ (as in Expression 3.8 holds true), and the schedule is feasible if whenever $u_i$ (the time for a robot arm 130 to drop a wafer into a processing module) is enabled, the wafer processing time (i.e. wafer soujourn time) is greater than or equal to a minimum value $\alpha_i$ or less than or equal to the minimum value plus the longest time to remove the wafer $\alpha_i + \delta_i$. This relationship is explained as $\alpha_i \leq \tau_i \leq \alpha_i + \delta_i$.

One of the three programs, including a first algorithm or program 600, or linear programs, 700, 800 (which can exist as programmed methods or algorithms as stored in memory of a computing device) is selected to determine a schedule to control the cluster tool apparatus 100, 200. The program is selected based on the relationship between the processing cycle time and the robot cycle time.

Figure 6:
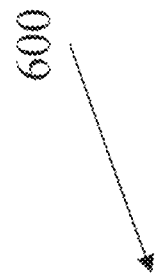
FIG. 6 shows an algorithm used to determine an optimal schedule for a robot of the cluster tool apparatus.

The first algorithm 600 is shown in FIG. 6. The first algorithm is selected if the robot cycle time is equal to the system cycle time, which is less than or equal to the longest natural workload of all the steps. This condition is defined as $\psi^* = \Pi \leq \xi_{iL}$, $i \in \mathbb{N}_n$. The first algorithm can be solved by the processor 302 utilizing the commercial solver 303 to determine a one wafer cyclic schedule by setting the robot waiting time. The first linear program can be solved due to its limited size.

Figure 7:
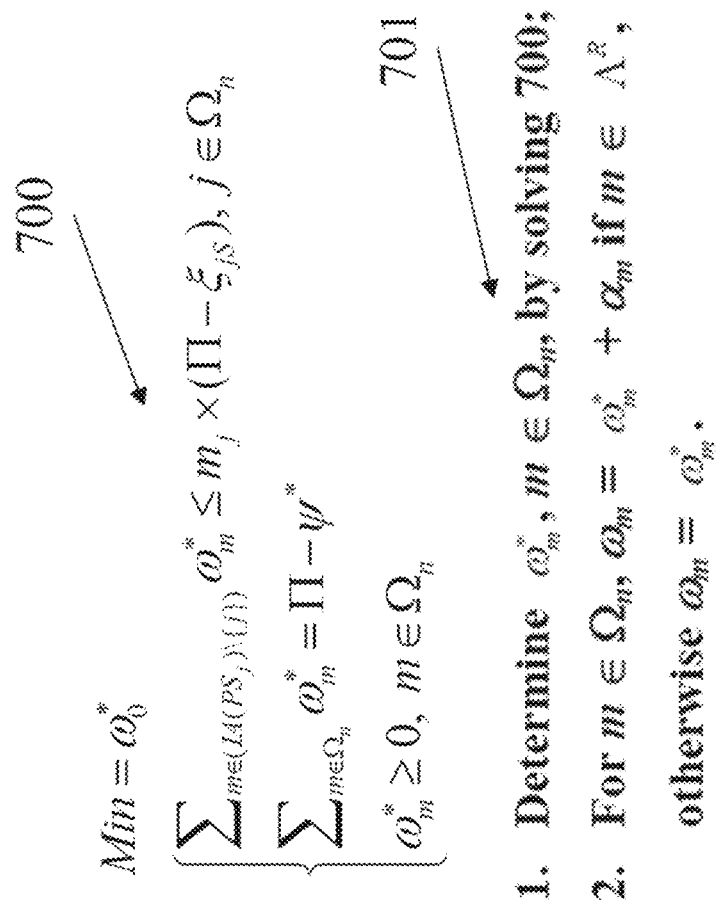
FIG. 7 shows a second algorithm that can be solved to determine an optimal schedule for a robot of the cluster tool apparatus.

The second program 700 (i.e. second algorithm), which is a linear program, is shown in FIG. 7. The second algorithm is selected if the robot cycle time is less than the system cycle time which is less than or equal to the longest natural load of all the steps. This is defined by $\psi^* < \Pi \leq \xi_{iL}$, $i \in N_n$. The second linear program 700 can be solved by the processor 302 using the commercial solver 303 to set robot waiting times and hence determine a schedule for the cluster tool apparatus.

Figure 8:
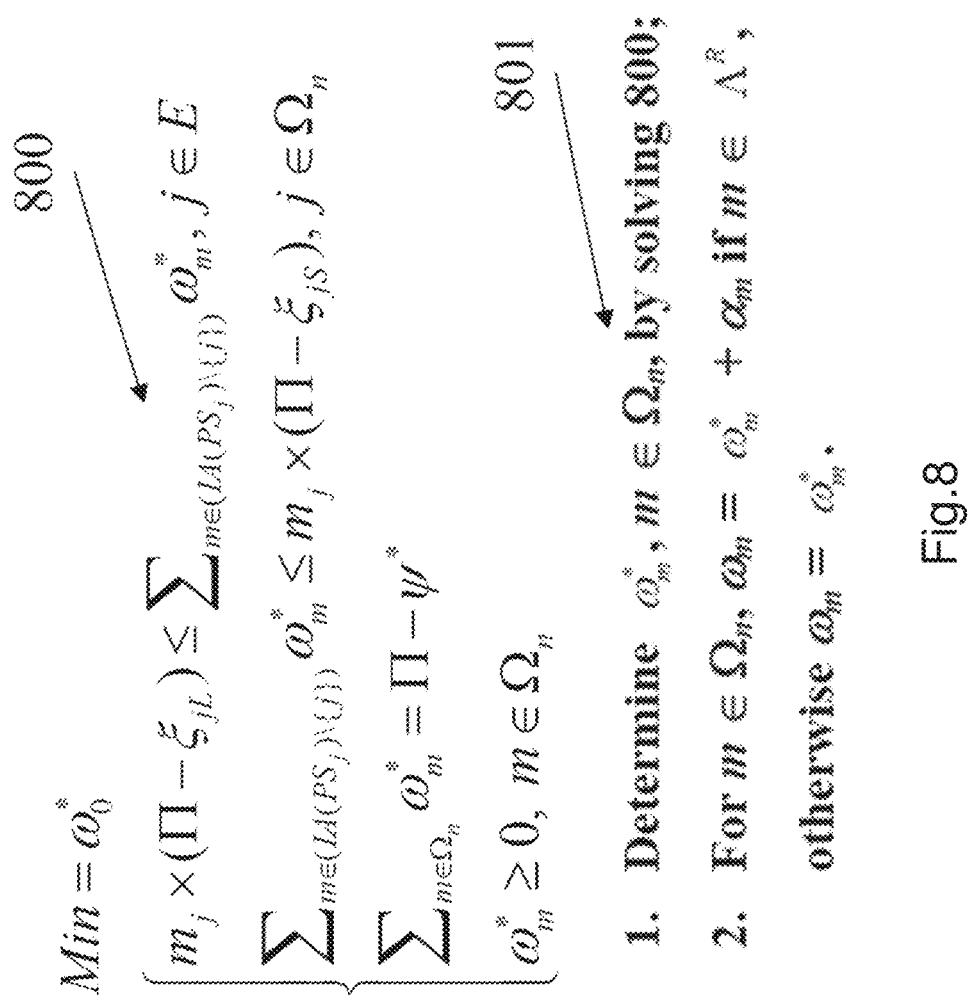
FIG. 8 shows a third algorithm that can be solved to determine an optimal schedule for a robot of the cluster tool apparatus.

The third program 800 (a linear program), which is also a linear program, is shown in FIG. 8. The third linear program is selected if, for some steps, the system cycle time is greater than the longest natural workload of these steps, and for these steps, the sum of the system cycle time minus the longest natural workload is less than or equal to the system cycle time minus the robot cycle time. Let $E = \{j | j \in N_n, \xi_{iL} < \Pi\}$ and $F = \Omega_n \backslash E$. The third program 800 (a linear program) is selected if $j \in E \neq \emptyset$ and $\partial = \Sigma_{j \in E} m_j \times (\Pi - \xi_{jL}) \leq \Pi - \psi^*$. The third program 800 is defined in FIG. 8. Specifically the third program (a linear program) also determines a schedule by setting robot waiting times. The robot waiting time is a non-negative value that is generated by solving one of the three programs. The feasible one-wafer schedule for performing a processing cycle, with a cycle time of $\Pi$ can be obtained if and only if the conditions given in one of the three programs 600, 700, 800 hold true.

Solving the programs is advantageous because the schedule generated by solving on the three programs results in an optimal schedule. This is because $\Pi$ is the lower bound of the cycle time for the cluster tool apparatus without a wafer residency time (i.e. a semiconductor product residency time). Any decrease in $\Pi$ will result in a non-feasible schedule for a processing cycle. Therefore the obtained schedule is an optimal schedule in the sense of cycle time.

Each program is implemented by the controller 300, and solved by the controller 300 based on a cluster tool apparatus 100, 200 with given activity times as shown in Table 500 of FIG. 5. The activity times as defined in the Table 500 are used as part of the program and used to determine an optimal schedule for the cluster tool operation. The controller 300, and in particular the processor 302 provides the robot waiting times to the robot 130 via the robot interface 306. The processor 302 transmits appropriate control signals to the processor modules based on the determined schedule. For example the processor controls the processing time of each processor module via the processor module interface 308. The processor modules 111-115 may each include an independent processor that receives control information from the main processor 302 and control the processor module based on the control information from the main processor 302. The control information can include time constraints provided by the user via the user interface 140.

FIG. 9 shows an embodiment of a method of controlling a cluster tool apparatus for processing a semiconductor product, such as for example a silicon wafer. The method 900 is implemented and executed by the controller 300 to control the operation or function of the cluster tool apparatus 100. The method begins at step 901. At step 901 a plurality of system parameters are received at the controller 300 via the user interface 140. The system parameters relate to one or more processing steps of the processing cycle. Specifically the system parameters relate to time values of various transitions for each processing step.

At step 902 the controller 300 determines a scheduling strategy for the cluster tool apparatus 100. The scheduling strategy can be selected based on a mathematical model of the cluster tool apparatus 100 processing cycle and the received system parameters. Preferably the scheduling strategy is stored in the memory unit 304 and accessed by the processor 302.

At step 903 a processing cycle time is determined by the controller based on the system parameters and a mathematical model of the system. A robot cycle time is determined at 904 based on the system parameters and a mathematical model of the system. The processor 302 is configured to determine the processing cycle time and the robot cycle time. At step 905 the controller 300 is configured to determine a relationship between the processing cycle time and the robot cycle time. The scheduling strategy is also used at step 903 and step 904 to determine the processing cycle time and robot cycle time.

At step 906 the controller 300 is configured to select a program from a plurality of algorithms or linear programs that are stored in the memory unit 304. The memory unit 304 stored the three programs (algorithms or linear programs) 600, 700 and 800. The program is selected based on the relationship between the processing cycle time and the robot cycle time. The first, second or third program is selected based on one of the relationships described earlier. The processor 302 may alternatively calculate or determine the programs 600, 700, 800 based on the system parameters and a mathematical model of the cluster tool apparatus.

At step 907 a schedule is determined for performing the processing cycle utilizing the one or more processing modules 111-115. The schedule is determined by solving the selected program 600, 700, 800. The schedule is determined based on a semiconductor product residency time (i.e. a wafer residency time). At step 908 the schedule outputs a robot waiting time that minimizes the processing cycle time while maintaining the semiconductor product residency parameter (i.e. maintaining the wafer residency time). At step 909 the controller 300 is configured to control the operation of the robot 130, 230 based on the determined schedule.

The controller 300 and specifically the processor 302 is configured to execute the method steps of method 900 of controlling a cluster tool apparatus. The processor 302 is further configured to control the operation of the robot based on the determined method and determined schedule. The method 900 outputs robot waiting times as part of the schedule and the processor 302 is configured to control the operation of the robot arm 130, via the robot interface 306, based on the robot waiting times that are determined.

Below are examples of implementation of the method of controlling the cluster tool apparatus. The examples are practical examples of the method showing how a schedule and robot waiting times are determined based on selecting and solving an appropriate linear program.

Example 1

There are three Steps 1, 2, and 3 with the number of processing modules for the steps being 1, 2, 1, respectively. In this example it takes 50, 116, and 6 time units for a processing module at Steps 1, 2, and 3 to process a wafer, respectively. It takes a further 3 time units for the robot to unload/load a wafer from/into a processing module or loadlock. It takes 10 time units for the robot to move between processing modules, or between the processing module and loadlocks. After being processed, a wafer can remain at Steps 1, 2, and 3 for at most 20 time units. In other words, we have $\alpha_1=50$, $\alpha_2=116$, $\alpha_3=6$, $\lambda=3$, $\mu=10$, and $\delta_1=\delta_2=\delta_3=20$. The system is modelled as a transport-bound cluster tool apparatus. The optimal scheduling strategy is determined as $(A_0A_2A_3A_1)$.

The shortest natural workload for each step, as per expression 3.5 earlier, is determined to be $\xi_{0S}=\alpha_3+6\lambda+4\mu=6+18+40=64$, $\xi_{1S}=\alpha_1+4\lambda+3\mu=50+12+30=92$, $\xi_{2S}=(\alpha_2+\alpha_3+6\lambda+4\mu)/2=(116+6+18+40)/2=90$, and $\xi_{3S}=\alpha_3+8\lambda+7\mu=6+24+70=100$. This is also equal to the robot cycle time $\psi^*$. Hence the system cycle time is defined as $\Pi=\max\{\xi_{0S},\xi_{1S},\xi_{2S},\xi_{3S},\psi^*\}=100$. The shortest natural workload is based on the mathematical model of the cluster tool apparatus.

The longest natural workload is determined using the expression 3.6, which is based on the mathematical model. The longest natural workload for each processing step, in this example case is $\xi_{1L}=\xi_{1S}+20=112$, $\xi_{2L}=\xi_{2S}+20/2=100$, and $\xi_{3L}=\xi_{3S}+20=120$. Thus, this results in $\psi^*=\Pi=100\leq\xi_{iL}$, $i\in N_3$, which relates to the use of the first program. Based on the first program 600, the robot waiting times for each processing step are determined to be $\omega_0=\omega^*_0=0$, $\omega_1=\omega^*_1=0$, $\omega_2=\omega^*_2=0$, and $\omega_3=\omega^*_3+\alpha_3=6$. The controller 300 is configured to operate the robot based on the robot times determined by solving the first program.

Example 2

In this example all the system parameters are maintained the same as example 1, except the wafer (i.e. semiconductor product) processing time at the second processing step is set at 140 time units, i.e. $\alpha_2=140$. In this example, the optimal scheduling strategy is still determined as $(A_0A_2A_3A_1)$. With this scheduling strategy, a robot cycle time and processing cycle time are determined using the mathematical model of the cluster tool apparatus. Specifically the robot cycle time and the processing cycle time are determined based on the shortest natural workload at each processing step. This is defined as $\xi_{0S}=\alpha_3+6\lambda+4\mu=64$, $\xi_{1S}=\alpha_1+4\lambda+3\mu=92$, $\xi_{2S}=(\alpha_2+\alpha_3+6\lambda+4\mu)/2=(140+6+18+40)/2=102$, $\xi_{3S}=\alpha_3+8\lambda+7\mu$. $100=\psi^*$, and $\Pi=\max\{\xi_{0S},\xi_{1S},\xi_{2S},\xi_{3S},\psi^*\}=102$. A longest natural workload is determined using expression 3.6. The longest workload for each processing step is determined, based on the mathematical model. The longest workload is defined, in this example, as $\xi_{iL}=\xi_{1S}+20=112$, $\xi_{2L}=\xi_{2S}+20/2=112$, and $\xi_{3L}=\xi_{3S}+20=120$. Hence, $\psi^*=100<\Pi=102\leq\xi_{iL}$, $i\in N_3$ which relates to selecting and solving the second linear program 700. Solving the second linear program results in the following robot waiting times $\omega_0=\omega^*_0=0$, $\omega_1=\omega^*_1=0$, $\omega_2=\omega^*_2=2$, and $\omega_3=\omega^*_3+\alpha_3=6$. The controller controls the robot based on the determined robot waiting times that are determined by solving the second linear program.

In an alternative embodiment the user interface 140 may be remote from the cluster tool apparatus 100 and configured to communicate with the controller 300 of the cluster tool apparatus 100. The user interface 140 alternatively may be a key pad, a tablet, a smartphone or a laptop or another suitable mobile device that can wirelessly communicate with the controller 300 of the cluster tool apparatus 100. The remote user interface may include a suitable software program such as an application that allows a user to interface with the cluster tool apparatus and cluster tool apparatus controller 300.

It should be noted that in this disclosure the cluster tool may be referred to as a cluster tool apparatus or cluster tool system. The term apparatus and system are used interchangeably when describing the cluster tool and its operations.

It will be appreciated by persons skilled in the art that numerous variations and/or modifications may be made to the described cluster tool apparatus and method of controlling the cluster tool apparatus as shown in the specific embodiments without departing from the spirit or scope of the present disclosure. The present embodiments are, therefore, to be considered in all respects as illustrative and not restrictive.

The term "comprising" (and its grammatical variations) as used herein are used in the inclusive sense of "having" or "including" and not in the sense of "consisting only of"

It is to be understood that, if any prior art information is referred to herein, such reference does not constitute an admission that the information forms a part of the common general knowledge in the art, in Australia or any other country.

Although not required, the embodiments described with reference to the figures may be implemented as an Application Programming Interface (API) or as a series of libraries for use by a developer or can be included within another software application, such as a terminal or personal computer operating system or a portable computing device operating system. Generally, as program modules include routines, programs, objects, components and data files assisting in the performance of particular functions, the skilled person will understand that the functionality of the software application may be distributed across a number of routines, objects or components to achieve the same functionality desired herein.

It will also be appreciated that where the methods and systems of the present disclosure are either wholly implemented by computing system or partly implemented by computing systems then any appropriate computing system architecture may be utilised. This will include stand alone computers, network computers and dedicated hardware devices. Where the terms "computing system" and "computing device" are used, these terms are intended to cover any appropriate arrangement of computer hardware capable of implementing the function described.

The invention claimed is:

1. A method of controlling a transport-bound single-arm cluster tool to perform a processing cycle consisting of a plurality of processing steps, wherein the transport-bound single-arm cluster tool includes a plurality of processing modules for processing semiconductor products and a robot with a single-arm configured for moving a semiconductor product to and from the plurality of processing modules, the transport-bound single-arm cluster tool being configured to operate under a steady state in a transport-bound region in which a robot task time governs a processing cycle time relating to a duration required to complete one processing cycle, the method comprising the steps of:

receiving, from a user interface, a plurality of system parameters relating to one or more processing steps of the processing cycle;

determining, based on a semiconductor product residency time relating to a maximum amount of time that a semiconductor product can remain in any of the processing modules after being processed, a schedule for performing the processing cycle utilizing the plurality of processing modules; and determining a scheduling strategy that defines the order of processing steps in the processing cycle by solving a program so as to define an optimal schedule, wherein the scheduling strategy is determined based on a mathematical model of the processing cycle, wherein the mathematical model is a petri net that utilizes the plurality of system parameters to model the processing cycle and to model each processing step to include a plurality of transitions, wherein the system parameters include a time duration associated with each transition of the processing steps, and wherein the schedule outputs or sets one or more robot waiting times that minimize the processing cycle time while maintaining the semiconductor product residency time to define the optimal schedule.

2. The method of claim 1, wherein the processing cycle includes one or more semiconductor processing steps being conducted by the processing module, a robot loading step where the robot loads the semiconductor product into the processing module, and a robot unloading step where the robot unloads the semiconductor product from the processing module.

3. The method of claim 1, wherein the schedule is determined by selecting and solving a program from a plurality of programs, wherein the program relates at least the semiconductor residency time and a processing cycle time, and each program outputting at least the robot waiting times.

4. The method of claim 3, wherein the program selected for solving is based on a relationship between the processing cycle time and a robot cycle time, the program being selected from a total of three programs, and wherein the method comprises the step of solving the selected program to obtain the robot waiting time.

5. The method of claim 4 further comprising: selecting a first program if the robot cycle time equals the processing cycle time, selecting a second linear program if the robot cycle time is less than processing cycle time, and selecting a third linear program if the processing cycle includes using multiple processing modules for one or more processing steps.

6. The method of claim 1, wherein the system parameters further comprise one or more of:
a time value for processing at each processing module,
a time value for the robot to move between the plurality of processing modules,
a semiconductor product residence time,
an unloading time value for the robot to unload a semiconductor product from the processing module, and
a loading value unit for the robot to load a semiconductor product into the processing module, wherein the unloading time value and the loading time value are equivalent to each other.

7. A transport-bound single-arm cluster tool for processing a semiconductor product comprising;
a plurality of processing modules configured for processing semiconductor products,
a robot with a single-arm configured to load, transfer and unload a semiconductor product to and from the plurality of processing modules,
a controller configured to communicate with and control the robot, the controller further configured to execute the method of claim 1.

8. The transport-bound single-arm cluster tool of claim 7, wherein the processing cycle includes one or more semiconductor processing steps being conducted by the processing module, a robot loading step where the robot loads the semiconductor product into the processing module, and a robot unloading step where the robot unloads the semiconductor product from the processing module.

9. The transport-bound single-arm cluster tool of claim 7, wherein the schedule is determined by selecting and solving a program from a plurality of programs, wherein the program relates at least the semiconductor residency time and a processing cycle time, and each program outputs at least the robot waiting times.

10. The transport-bound single-arm cluster tool of claim 9, wherein the controller is configured to select a program from a plurality of programs based on a relationship between the processing cycle time and a robot cycle time, and wherein the controller is further configured to solve the selected program to output a robot waiting time.

11. The transport-bound single-arm cluster tool of claim 10, wherein a first program is selected if the robot cycle time equals the processing cycle time, a second linear program is selected if the robot cycle time is less than processing cycle time, and a third linear program is selected if the processing cycle includes using multiple processing modules for one or more processing steps.

12. The transport-bound single-arm cluster tool of claim 7, wherein the system parameters further comprise one or more of:
a time value for processing at each processing module,
a time value for the robot to move between the plurality of processing modules,
a semiconductor product residence time,
an unloading time value for the robot to unload a semiconductor product from the processing module, and
a loading value unit for the robot to load a semiconductor product into the processing module, wherein the unloading time value and the loading time value are equivalent to each other.

13. The transport-bound single-arm cluster tool in of claim 7, wherein the controller comprises a processor, a memory unit and a robot interface, the processor being in communication with the memory unit and the robot interface, wherein the memory unit is a non-transitory computer readable medium, the method of claim 1 being stored as a set of executable instructions, wherein the processor is configured to communicate with the memory unit, the processor being configured to execute the instructions and perform the method of claim 1, wherein the processor is configured to communicate with the robot via the robot interface and wherein the processor is configured to control at least the robot based on the method of claim 1.

* * * * *